United States Patent [19]
Wetzel

[11] 4,335,619
[45] Jun. 22, 1982

[54] MOTOR LOAD TEST APPARATUS

[75] Inventor: Donald A. Wetzel, Upper St. Clair, Pa.

[73] Assignee: Westinghouse Electric Corp., Pittsburgh, Pa.

[21] Appl. No.: 127,272

[22] Filed: Mar. 5, 1980

[51] Int. Cl.³ .................................................. G01L 3/22
[52] U.S. Cl. .................................................. 73/862.17
[58] Field of Search ................. 73/134, 862.17, 862.18

[56] References Cited

U.S. PATENT DOCUMENTS

| | | | |
|---|---|---|---|
| 2,389,572 | 11/1945 | Winther | 73/134 |
| 2,440,076 | 4/1948 | Cassidy | 73/134 X |
| 3,595,073 | 7/1971 | Morris | 73/134 |
| 3,898,875 | 8/1975 | Knoop et al. | 73/134 X |

Primary Examiner—Charles A. Ruehl
Attorney, Agent, or Firm—Benjamin Hudson, Jr.

[57] ABSTRACT

This invention provides a unique system for measuring torque and speed characteristics of motors. This invention employs the principle of driving an induction generator beyond its synchronous speed until it generates power fed back into the power supply. Thus, a test motor can be loaded to its full load potential and only the losses of the test motor, generator, and other components are supplied by the power distribution system. Consequently, a substantial savings in cost are obtained compared to other conventional motor testing apparatus.

5 Claims, 1 Drawing Figure

MOTOR LOAD TEST APPARATUS

BACKGROUND OF THE INVENTION

1. Field of the Invention

This invention relates generally to motor load testing systems and apparatus used to measure torque and speed characteristics of motors.

2. Description of the Prior Art

Traditionally, torque and speed characteristics of motors have been measured with dynamometers. In absorption dynamometers, braking force is applied to the machine being tested and torque is determined from the amount of force required to reduce the motor speed to some full-load value. Dynamometers of this type absorb the total power delivered by the machine being tested. In addition to the energy dissipated in the brake, large machines may require cooling water systems for the heat generated that include additional cooling tower, pumps, and sewage costs. Comparatively, resistance type loading of a generator driven by a test motor has similar large costs where energy is wasted. In addition, whenever energy is wasted utilizing these methods, higher demand capabilities are required from the utilities at a cost above normal operating demand capacities. Other means such as direct current motor generator sets require more investment in capital equipment, more sophisticated control and considerably lower overall efficiency. Today's energy demands make efficient use of power a necessity. Consequently, conventional torque testing apparatus and systems can be extremely expensive.

SUMMARY OF THE INVENTION

In accordance with the principles of this invention an apparatus and method of testing motors has been developed that saves a substantial amount of the power required for these tests. The apparatus disclosed in this application allows a test motor to be loaded to its full load potential and at the same time generates power back into the electrical power distribution system. In some cases, the total amount of power expended can be as little as 25% of the power normally required to make these tests using conventional apparatus. This new apparatus is unique in that only the losses of the test motor, generator, and other components are supplied by the power distribution system. The difference between the input power and losses is returned to the power supply.

DESCRIPTION OF THE PREFERRED EMBODIMENTS

Figure 1:
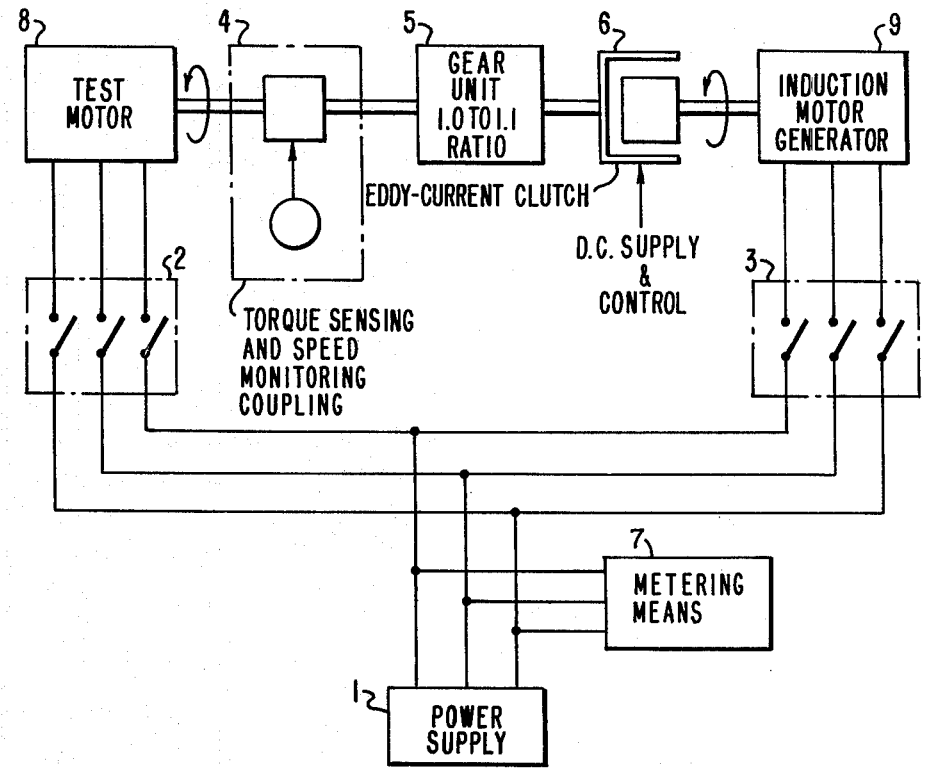
FIG. 1 is a block diagram of the apparatus in accordance with the principles of this invention.

Referring to FIG. 1 there is shown a distribution panel 1 that supplies electrical power to the starter 2 for the test motor 8 and the starter 3 for the induction generator 9. The test motor is first coupled to a torque sensing and speed monitoring coupling 4. This coupling displays on remote instruments the speed and torque developed by the test motor. The first coupling is then connected to a second coupling 5 which, for the purpose of this invention, is a gear unit although variable pitch sheaves with multiple belting can be used. A gear unit is shown in FIG. 1 with a 1.0 to 1.1 ratio. For the purpose of this invention it has been found from experimentation that where the test motor and the induction generator have the same numbers of poles or synchronous speeds, the 1.0 to 1.1 gear ratio gives the system optimum versatility. This occurs because the gear ratio affects the slip range in the eddy-current coupling or other controllable slip means used. Experimentation has shown that the broader the controllable slip range, the more versatility the system has to accommodate different motors that have different full-load speeds. However, depending upon the motor tested other gear ratios may be used. The output of the gear unit 5 is then connected to the input of an eddy-current clutch 6. Note that another embodiment of this invention would be to use a unit that combined the controllable slip coupling 5 and the eddy-current clutch 6 into one unit. Also any variable slip means with a constant input and a variable output may be used such as hydraulic couplings. The output of the eddy-current clutch 6 is then coupled to the induction generator 9.

To test for torque using this apparatus the test motor 8 and the induction generator 9 are started by connecting power through suitable breakers and starting devices 1, 2, and 3, both the motor and generator having the same rotation direction. At this time the eddy-current clutch is not energized. From FIG. 1 it can be seen that the gear unit has increased the input shaft speed of the eddy-current clutch to 1.1 times the test motor speed. The excitation field of the clutch is now gradually energized by applying a d.c. voltage. This excitation of the clutch tends to increase the generator speed toward its synchronous speed, the motor will drop slightly in speed since it now is providing friction and windage losses of the system including the generator. Increasing the d.c. excitation voltage of the clutch further begins to drive the generator beyond its synchronous speed and now the generator begins to feed power back into the supply system. A metering means 7 may be provided to measure the amount of power fed back into the system. The power load produces a counter torque which loads the motor, slowing it down toward its full load speed. Torque output and RPM readouts from the first coupling are multiplied and divided by 5252 to determine the motor test shaft horsepower output. Consequently, the difference between the HP input (KW equivalent) and shaft HP output is, of course, the motor's losses. % Efficiency of the motor is derived by $$\% \ EFF = HP \ \text{Output} \div \frac{KW \ \text{input} \times 1000}{746} \times 100$$

The significant energy savings difference between this application and an absorption type dynamometer while at the same time applying full load to the motor is shown by the following example: Assume:

| 500 HP test motor | 500 HP generator |
|---|---|
| 94% eff., .93 p.f. | 94% eff., .93 p.f. |
| 2300 volts | 2300 volts |
| 107.1 amps | 480.52 HP Delivered to Shaft |
| 426.68 KVA Input | 358.47 KW Delivered to Shaft |
| 396.81 KW Input | 336.96 KW to Line @ .94 eff. |
| 531.91 HP Input | 362.3 KVA |
| | 90.95 Amp. |

Total energy expended is 59.85 KW. The efficiency of the apparatus in this example is 84.92% or only 15.08% of the total power developed by the apparatus was expended. In contrast a conventional absorbtion dynamometer would expend 100% of the 396.81 KW input developed by the test motor. It can be seen from the foregoing that a more efficient method has been disclosed in this application that greatly advances the art of testing torque and loading characteristics of motors.

I claim:

1. A motor test apparatus comprising:
a first coupling means for connecting a test motor thereto; a second coupling means connected to the first coupling means; a controllable slip means connected to the second coupling means; an induction generator connected to the controllable slip means; starting means for supplying an electrical power system to the test motor and induction generator; the test motor being disposed to drive the first coupling means at a first speed and torque; the second coupling means being disposed to increase the first speed and torque to a second speed and torque; the controllable slip means being disposed to drive the induction generator until it generates power back into the electrical power system and loads the test motor to a full load speed.

2. A motor test apparatus as recited in claim 1 where the first coupling means is comprised of torque measuring and speed monitoring means.

3. A motor test apparatus as recited in claim 1 where the second coupling means is comprised of a gear unit with a 1.0 to 1.1 ratio.

4. A motor test apparatus as recited in claim 1 where the controllable slip means is comprised of an eddy current clutch having a constant speed input shaft and variable speed output shaft, wherein said constant speed input shaft is connected to the output shaft of the second coupling means, and said variable speed output shaft is connected to the induction generator.

5. A motor test apparatus as recited in claim 1 further comprising metering means to measure the power generated by the induction generator.

* * * * *